(12) United States Patent
Kim

(10) Patent No.: US 7,823,260 B2
(45) Date of Patent: Nov. 2, 2010

(54) METHOD FOR MANUFACTURING METAL-INSULATOR-METAL CAPACITOR

(75) Inventor: Baek-Won Kim, Seongbuk-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 206 days.

(21) Appl. No.: 12/145,327

(22) Filed: Jun. 24, 2008

(65) Prior Publication Data

US 2009/0000094 A1 Jan. 1, 2009

(30) Foreign Application Priority Data

Jun. 26, 2007 (KR) .................. 10-2007-0062698

(51) Int. Cl.
*H01G 7/00* (2006.01)
(52) U.S. Cl. .................. 29/25.41; 29/25.42; 29/830; 29/846
(58) Field of Classification Search ............... 29/25.41, 29/25.42, 830, 846
See application file for complete search history.

(56) References Cited

U.S. PATENT DOCUMENTS

| | | | | |
|---|---|---|---|---|
| 5,994,207 | A * | 11/1999 | Henley et al. ............... | 438/515 |
| 6,291,313 | B1 * | 9/2001 | Henley et al. ............... | 438/458 |
| 6,548,382 | B1 * | 4/2003 | Henley et al. ............... | 438/526 |
| 6,890,838 | B2 * | 5/2005 | Henley et al. ............... | 438/475 |
| 7,435,613 | B2 * | 10/2008 | Barber et al. .................. | 438/53 |
| 2002/0115230 | A1 * | 8/2002 | Barber et al. .................. | 438/53 |
| 2005/0070071 | A1 * | 3/2005 | Henley et al. ............... | 438/459 |
| 2009/0049670 | A1 * | 2/2009 | Barber et al. ............... | 29/25.35 |

* cited by examiner

*Primary Examiner*—C. J Arbes
(74) *Attorney, Agent, or Firm*—Sherr & Vaughn, PLLC

(57) ABSTRACT

A method of manufacturing a metal-insulator-metal (MIM) capacitor that includes at least one of the following steps: Sequentially forming a bottom metal film, an insulating film, and a top metal film over a wafer. Forming a first pattern for etching the top metal film and the insulating film. Etching the top metal film and the insulating film, using the formed first pattern, and then stripping the first pattern. Conducting a heat treatment and a cooling split for the wafer. Forming a metal pattern for etching the bottom metal film. Etching the bottom metal film, using the formed metal pattern, and then stripping the metal pattern.

19 Claims, 7 Drawing Sheets

Figure 1A:
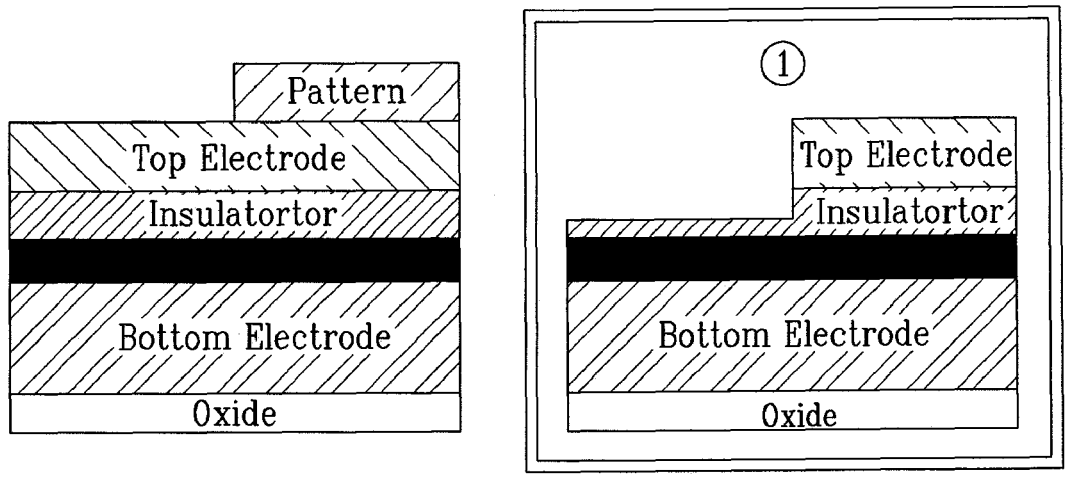

| Test# | Delay Time | Fail Shot Number | Fail Rate(%) |
|---|---|---|---|
| #1 | 0min | 0/72 | 0% |
| #2 | 15min | 0/72 | 0% |
| #3 | 30min | 0/72 | 0% |
| #4 | 90min | 27/72 | 38% |
| #5 | 120min | 64/72 | 89% |

| Test# | Heating temp. | Quench | Fail Shot Number | Fail Rate(%) |
|---|---|---|---|---|
| #1 | 270℃ | | 53/72 | 74% |
| #2 | 300℃ | Applied | 0/72 | 0% |
| #3 | 330℃ | | 0/72 | 0% |

METHOD FOR MANUFACTURING METAL-INSULATOR-METAL CAPACITOR

The present application claims priority under 35 U.S.C. 119 to Korean Patent Application No. 10-2007-0062698 (filed on Jun. 26, 2008), which is hereby incorporated by reference in its entirety.

BACKGROUND

Embodiments relate to a semiconductor device and/or a method of manufacturing a metal-insulator-metal (MIM) capacitor. A variety of semiconductor devices may include MIM capacitor structures. Examples of types of MIM capacitors include trench type MIM capacitors and plate type MIM capacitors, which may be distinguishable by the way they are formed.

In a plate type MIM capacitor, an insulator may be deposited over a bottom electrode. The bottom electrode may be formed by sputtering. A relatively small amount of Cu may be added to an AlCu alloy, which may prevent electro-migration (EM). A top electrode may be formed by sputtering. Patterning may be performed in an MIM capacitor region. An MIM capacitor region may be selectively etched (e.g. using plasma). Other patterning and/or etching processes may be conducted to form a normal metal line for a top electrode.

An abnormal phenomenon may occur during a process of removing unnecessary photoresist during an etching process (e.g. using plasma). For example, equipment failure may occur. When processing of wafers is delayed in a striping chamber, a metal line bridge may form during a subsequent metal etching process for forming a bottom electrode. As a result, a metal electrode may be formed defectively (e.g. have Comb Leakage Failure).

SUMMARY

Embodiments relate to a method of manufacturing a metal-insulator-metal (MIM) capacitor, which eliminates and/or minimizes failures caused by bridges forming during an etching process. Embodiments relate to a method of manufacturing an MIM capacitor, which eliminates and/or minimizes failures caused during an etching process during formation of a bottom electrode.

In embodiments, a method of manufacturing a metal-insulator-metal (MIM) capacitor includes at least one of the following steps: Sequentially forming a bottom metal film, an insulating film, and a top metal film over a wafer. Forming a first pattern for etching the top metal film and the insulating film. Etching the top metal film and the insulating film, using the formed first pattern, and then stripping the first pattern. Conducting a heat treatment and a cooling split for the wafer. Forming a metal pattern for etching the bottom metal film. Etching the bottom metal film, using the formed metal pattern, and then stripping the metal pattern.

In embodiments, a method may include rinsing the wafer after the stripping of the first pattern. A heat treatment and/or a cooling split may be conducted for 200 seconds. A heat treatment and/or a cooling split may be heated to at least a predetermined temperature and then quenched. A heating temperature of a wafer may be equal to or less than a melting temperature of an alloy used to form a top metal film and/or an alloy used to form the bottom metal film. A heating temperature for a wafer may be controlled in accordance with a delay time given in a chamber, where the etching and stripping are conducted. A bottom metal film may include a film for forming a bottom electrode. A bottom metal film may include Al and/or AlCu. A top metal film may include a film for forming a top electrode. A top metal electrode may include Ti and/or TiN. An insulating film may include SiN.

DRAWINGS

Figure 1B:
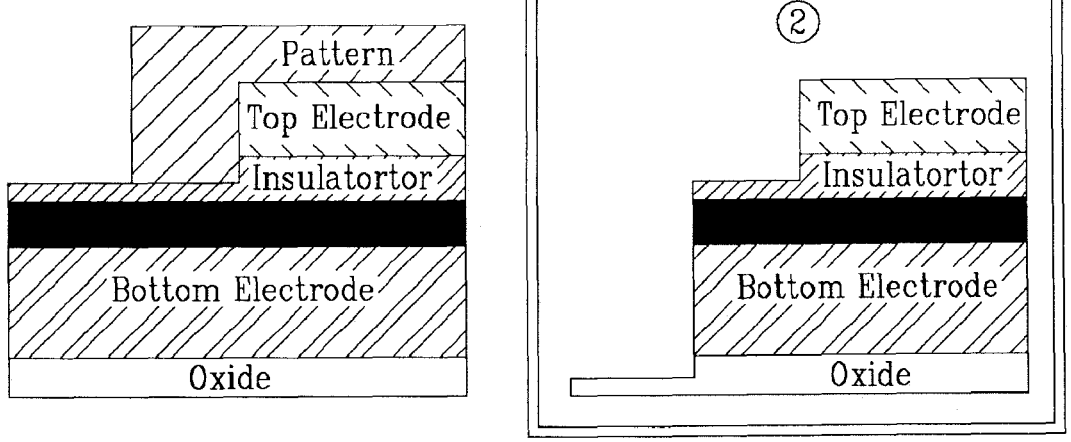

Example FIGS. 1A and 1B are sectional views illustrating procedures for forming a plate type metal-insulator-metal (MIM) capacitor, in accordance with embodiments.

Figure 2:
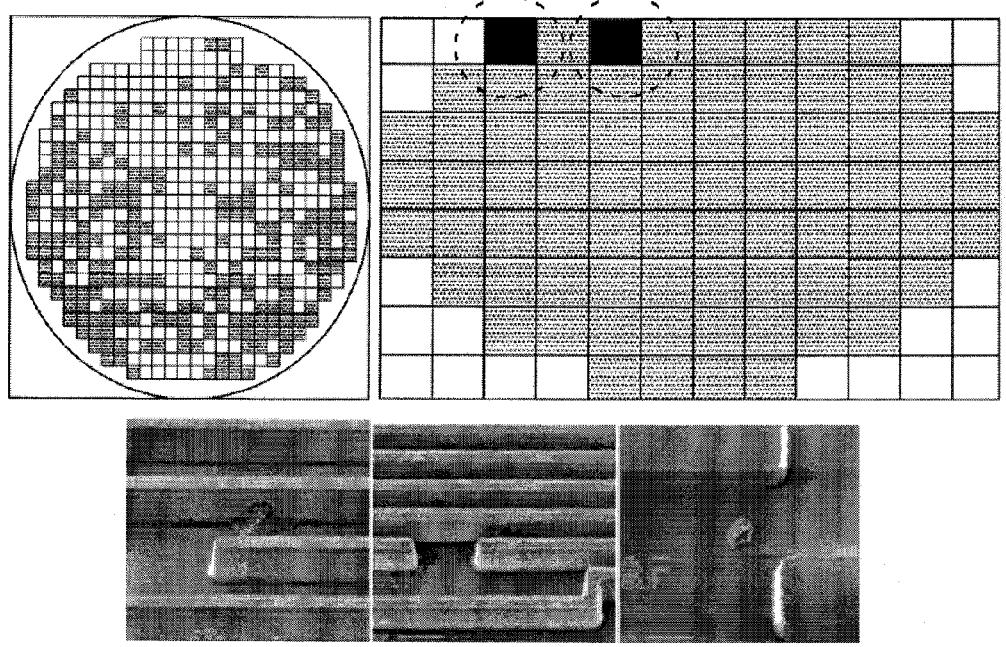

Example FIG. 2 is a view illustrating a metal line bridge occurring in a metal etching process of forming a bottom electrode, in accordance with embodiments.

Figures 3A, 3B:
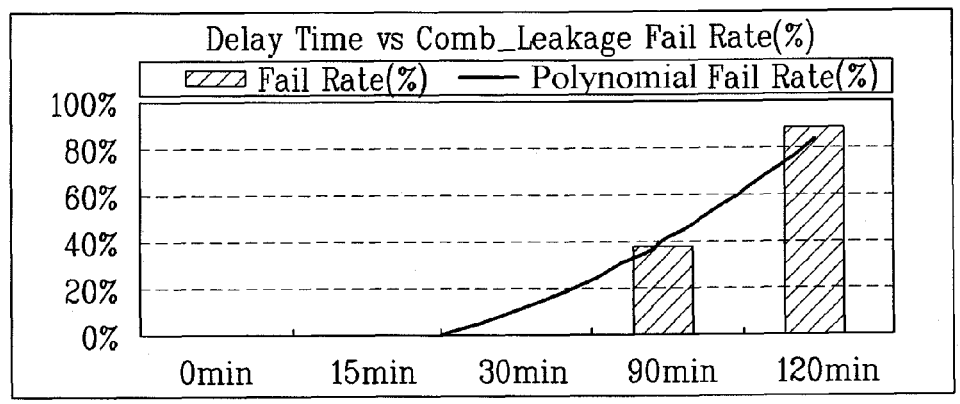

Example FIGS. 3A to 3B illustrate a delay time split in a stripping process conducted after an etching process during the formation of a top electrode, in accordance with embodiments.

Figure 4A:
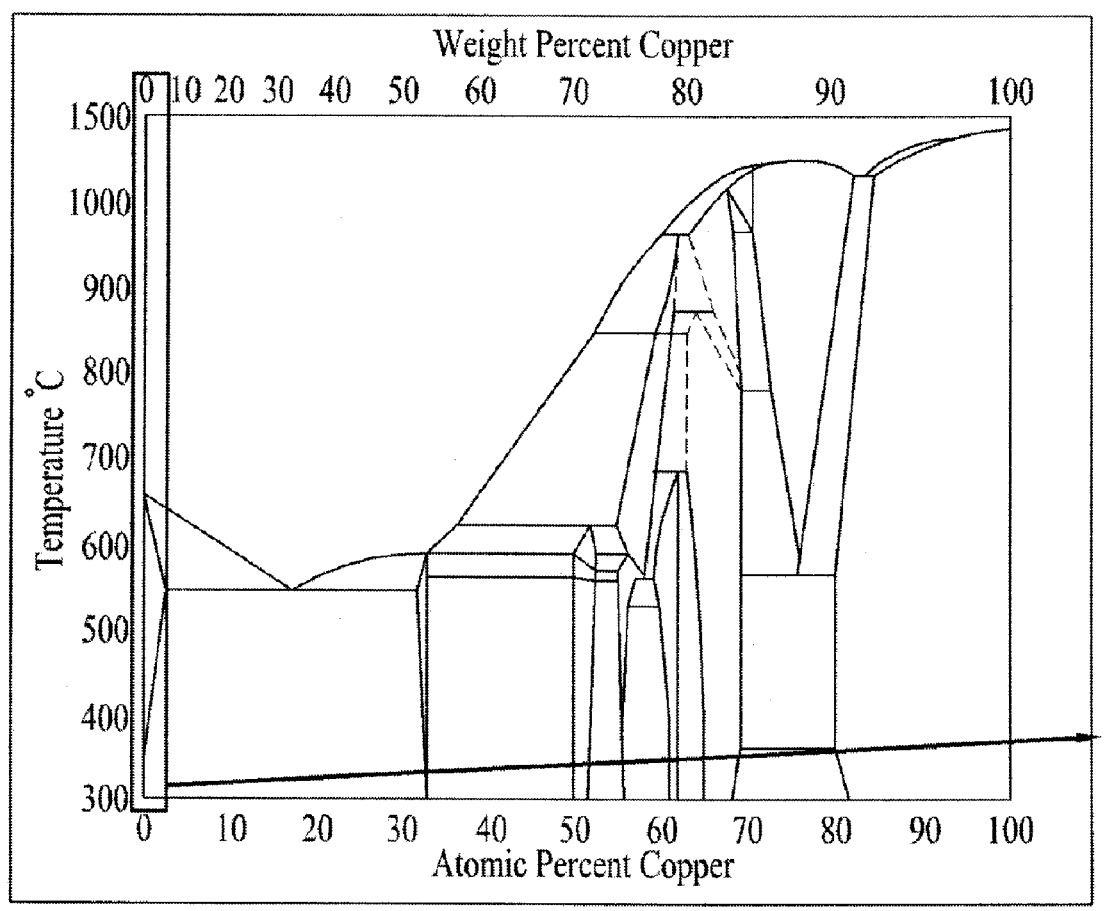
Figure 4B:
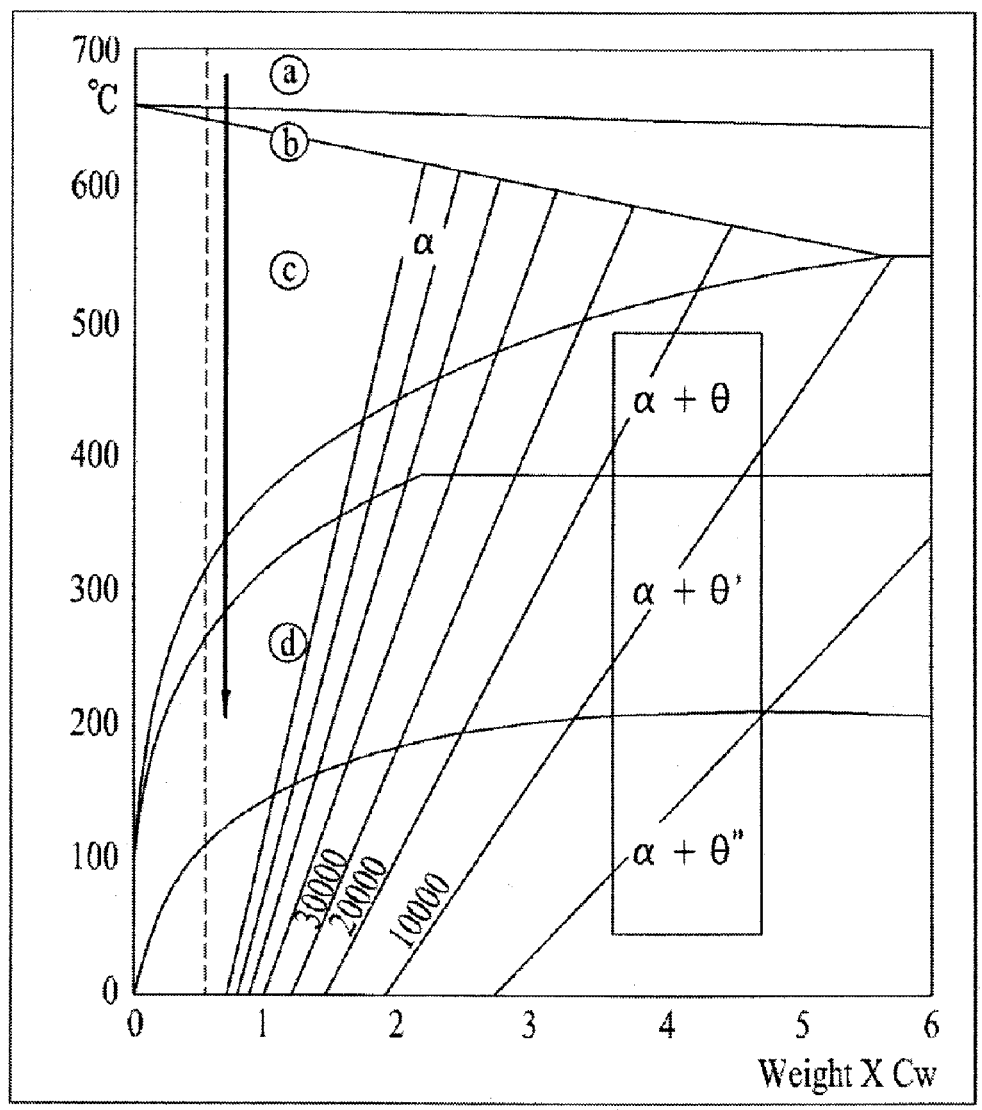

Example FIGS. 4A and 4B are diagrams illustrating phases of an AlCu alloy, to identify a mechanism adversely affecting an etching process in the formation of a bottom electrode when wafer processing is delayed in an etching process of the formation of a top electrode, in accordance with embodiments.

Figures 5A, 5B:
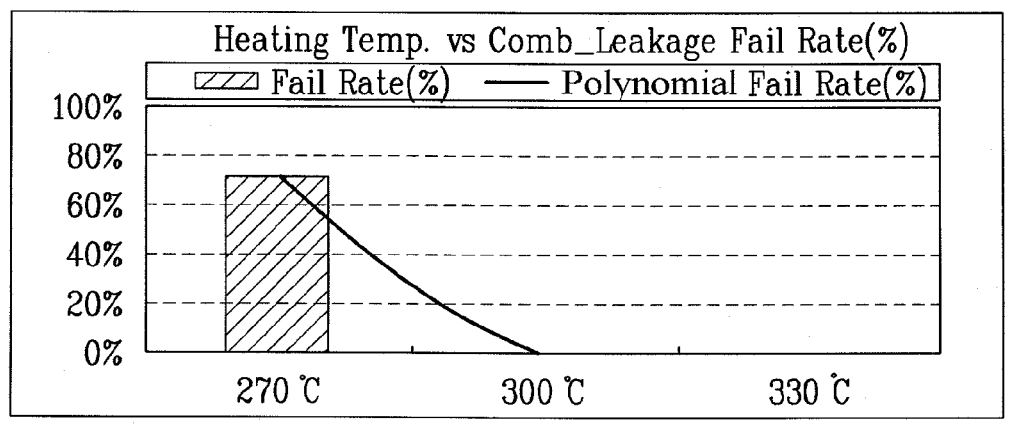

Example FIGS. 5A to 5B are views illustrating results exhibited during a stripping process conducted using a heat treatment after an etching process of the formation of a top electrode, in accordance with embodiments.

Figure 6:
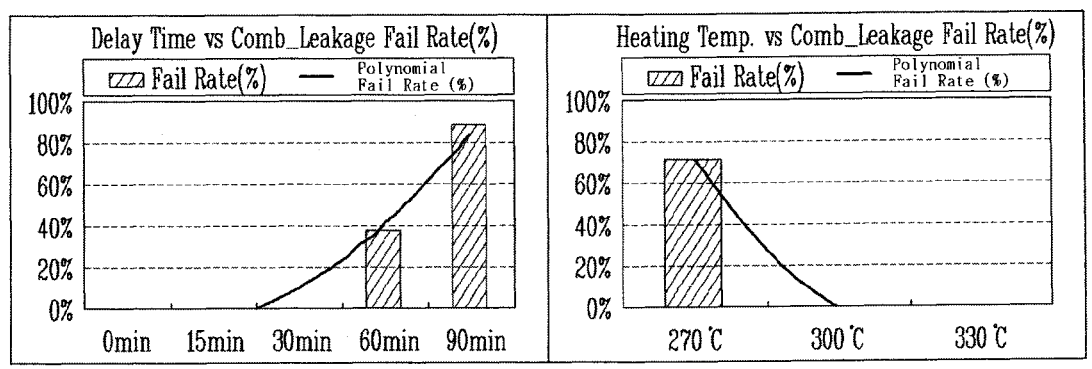

Example FIG. 6 is a diagram illustrating the relation between a delay time and a fail rate in metal electrode formation and the relation between a heat treatment temperature and the fail rate in metal electrode formation, in accordance with embodiments.

DESCRIPTION

Example FIGS. 1A and 1B are sectional views illustrating a procedure of forming a plate type metal-insulator-metal (MIM) capacitor, in accordance with embodiments. As illustrated in FIG. 1A, an MIM structure may have films sequentially layered over a wafer. For example, a bottom metal film, an insulating film, and a top metal film may be sequentially layered over the wafer to form an MIM structure. A bottom metal film may be adapted to form a bottom electrode and a top metal film may be adapted to form a top electrode.

In embodiments, a top electrode may include TiN and/or an insulating film may include SiN. A pattern may be formed to etch the top electrode (TiN) and/or an insulating film (SiN). Using the formed pattern, the top electrode (TiN) and the insulating film (SiN) may be etched. After etching, the pattern may be stripped.

As illustrated in FIG. 1B, a metal pattern may be formed for etching the metal film (Al or AlCu) of the bottom electrode, in accordance with embodiments. A Ti/TiN film may be formed over the metal film. Using the formed metal film, metal etching may be performed to form a normal metal line (e.g. the bottom electrode). In embodiments, a plate type MIM capacitor may be formed. However, embodiments may relate to other structures other than plate type MIM capacitors. For example, embodiments may be applied to different types of MIM capacitors.

In embodiments, a heat treatment and a quenching split of a wafter may be performed before an etching process of a lower electrode (e.g. before the formation of a metal pattern for the formation of the lower electrode). Through processes, it may be possible to eliminate and/or minimize formation of abnormal metal patterns and/or prevent formations of metal line bridges that may cause defects in lines.

A delay may occur in a strip chamber during a metal etching process when forming the MIM capacitor. This delay may cause failures in the formation of metal electrodes. For example, there may be a failure in the formation of a metal electrode that includes an abnormal metal pattern and/or formation of metal line bridge. Metal line bridges may cause metal lines to function defectively.

In the formation of a metal film having a laminated MIM structure, a process of removing a photoresist may be performed after an etching process that forms a top electrode. However, when processing of a wafer is delayed in a high-temperature chamber during photoresist removal, a metal line bridge may be formed during a subsequent metal etching process for the formation of a bottom electrode, as shown in FIG. 2, in accordance with embodiments.

Embodiments relate to a process of forming a laminated MIM structure. A buffer oxide film may be formed over a silicon wafer. In embodiments, the silicon wafer may be a bare Si wafer. Metal sputtering may be performed to form metal films for formation of a bottom electrode. In embodiments, example materials and thicknesses of the metal films may include Ti at approximately 100 Å, AlCu at approximately 4,500 Å, Ti at approximately 50 Å, and/or TiN at approximately 600 Å.

In embodiments, an insulating film may be deposited over the metal films. In embodiments, the insulating film may include SiN. In embodiments, the insulating film may have a thickness of approximately 640 Å. A sputtering process may be performed to form a film of a top electrode. For example, in embodiments, TiN is sputtered (e.g. to a thickness of approximately 1,000 Å) to form the upper electrode. After a film of a top electrode is formed, a pattern is formed for the formation of a MIM structure.

Using the formed pattern, an etching process and a stripping process may be performed. For example, the etching process and the stripping process processes may be performed using a TCP 9606 etcher manufactured by LAM Company. A delay time split occurring during the stripping process performed after the etching process is illustrated in FIGS. 3A and 3B, in accordance with embodiments.

In embodiments, an arc deposition process may be performed to form a SiON film (e.g. having a thickness of approximately 250 Å) and/or an SiO2 film (e.g. having a thickness of 50 Å). A metal pattern, which may be used in an etching process for formation of the bottom electrode, may then be formed. Using the metal pattern, the metal films for the bottom electrode may be etched and stripped. Etching and stripping may be performed in a Centura 5200 DSP chamber manufactured by AMAT Company.

Time delays may occur in the strip chamber (e.g. due to abnormal situations, such as a failure of equipment), after an etching process forming the top electrode. The length of wafer delay time in a strip chamber may be proportional to the failure rate of the formation of the bottom electrode. For example, if there are significant delays in the strip chamber, defects may occur in a subsequent metal etching process that forms the bottom electrode.

For example, when wafer processing performed in a strip chamber (e.g. maintained at a relatively high temperature of approximately 250° C.) is delayed after an etching process that forms the top electrode, the laminated metal films for the formation of the bottom electrode may be adversely affected. As a result, the etching process for the formation of the bottom electrode may be adversely affected.

Example FIGS. 4A and 4B show phases of an AlCu alloy, in accordance with embodiments. For example, a mechanism adversely affecting the etching process may be identified for the formation of the bottom electrode. In embodiments, wafer processing in a strip chamber may be maintained at a high temperature (e.g. approximately 250° C.) while further processing is delayed after an etching process for the formation of the top electrode. As illustrated in FIGS. 4A and 4B, it can be seen from the laminated metal structure of the bottom electrode, an Al-0.5% wt Cu alloy may be used to secure a desired electro-migration (EM) margin for metal lines, in accordance with embodiments.

Referring to the phase diagrams of FIGS. 4A and 4B, an Al-0.5 wt % Cu alloy may exhibit a phase variation depending on a variation in temperature, as follows:

Phase Variation Depending on Temperature Variation: Liquid ((ⓐ))→α+Liquid ((ⓑ))→α(ⓒ))→α+θ(ⓓ))

Division of Phase α+θ into sub-phases (in accordance with a crystalline structure difference): α+θ/α+θ'/α+θ".

As illustrated in the phase diagrams of FIGS. 4A and 4B, it can be seen that the wafer is slowly cooled in accordance with a delay occurring in the stripping chamber (e.g. processing temperature of 250° C.) due to a failure occurring after the etching process for the formation of the top electrode. This may result in the temperature of the α-phase AlCu alloy in the laminated metal structure.

In embodiments, θ-phase nuclei may be formed. Nuclei may be gradually grown in different regions, in order to form an equilibrium "α+θ" structure. When viewing from a variation in the temperature of the stripping process, it may be seen that there is a phase variation from "α" to "α+θ" or from "α+θ" to "α+θ'".

For example, the temperature of a wafer may be slowly lowered as the wafer processing in the strip chamber is delayed. Due to this temperature lowering, the phase of the Al-0.5% wt Cu alloy in the laminated metal films may exhibit a phase variation from "α" to "α+θ" or from "α+θ" to "α+θ'". As a result, the etching for the formation of the bottom electrode may become under-etched. Due to the under-etching, a metal line bridge may occur.

When a normal fast cooldown process (e.g. a quenching process) is performed in the strip chamber without any delay (e.g. caused by equipment failure), a considerable reduction in diffusion time may be achieved. As a result, an unequilibrium α-phase may be maintained. Further, a "α+θ" phase may exhibit a variation in crystalline structure due to temperature variations.

The distance between Cu atoms and Al atoms may increase as temperature is reduced, which may result in a separated Cu crystalline structure with segregated Cu atoms. Such a structure may interfere with metal etching.

Phase variations between Al and Cu in may occur in laminated metal films (e.g. for a bottom electrode) due to a reduction in the actual temperature of the wafer during a wafer processing delay in the strip chamber. Accordingly, metal line bridges may occur in a subsequent etching process due to under-etching (e.g. in a region with segregated Cu atoms). Accordingly, failures may occur during the formation of metal electrodes.

Embodiments relate to a heat treatment, which includes heating and quenching. An etching and stripping processes for formation of a top electrode may be conducted on a wafer that is under delay (e.g. a delay of 60 minutes). The wafer may be rinsed (e.g. using a rinsing solution such as a solvent). A heat treatment and a quenching split may be conducted (e.g. for 200 seconds). For example, there may be a delay of 60 minutes in a stripping chamber, which may generate phase variations of the AlCu alloy.

In embodiments, a heat treatment may be performed during the delay. The heat treatment may include a heating process and a quenching process. The heating process may be performed at a predetermined temperature (e.g. at or above a melting temperature of 300° C.). A quenching process may be performed in the stripping chamber for the wafer (e.g. which is being delayed) after the etching process that forms a top electrode.

Accordingly, in embodiments, the phase of the AlCu alloy in the laminated metal films is varied as follows:

$\alpha+\theta/\alpha+\theta'/\alpha+\theta'' \rightarrow \alpha$.

Since the phase of the AlCu alloy may be varied to an "$\alpha$" phase, it may be possible to prevent failures from occurring in the bottom electrode, due to formations of metal line bridges in a subsequent etching process. Example FIGS. 5A to 5B, illustrate how it may be possible to prevent failures.

For example, when the delay time in a strip is relatively long (e.g. 90 minutes), the heat treatment may be performed at a higher temperature (e.g. approximately 320° C. for approximately 200 seconds). Results of a DC parametric full map under certain conditions may illustrated that metal electrodes may be formed without any significant failures and/or the results of a MPY are favorable.

Example FIG. 6 is a diagram illustrating an example relation between the delay time and the fail rate in metal electrode formation and an example relation between a heat treatment temperature and the fail rate in metal electrode formation, in accordance with embodiments.

A fail rate in metal electrode formation may increase proportionally to the delay time, as the delay time becomes greater than a predetermined period of time. In embodiments, a wafer (e.g. which has been varied in phase in the stripping chamber due to a relatively long delay time) may be heat treated at an heating temperature that is at least the melting temperature (e.g. 300° C.) of the AlCu alloy in the laminated metal films. In a heat treatment, the phase of the AlCu alloy in the laminated metal film may recover to an original phase (for example, $\alpha+\theta/\alpha+\theta'/\alpha+\theta'' \rightarrow \alpha$).

In embodiments, a heat treatment (e.g. including heating and quenching) may be performed after an etching process that forms a top electrode. Accordingly, it may be possible to prevent and/or minimize failures due to bridge being formed during an etching process for metal films having an MIM capacitor structure.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming at least one bottom metal film over a wafer;
   forming at least one insulating film over said at least one bottom metal film;
   forming at least one top metal film over said at least one insulating film;
   forming a first pattern over said at least one top metal film in order to partially etch said at least one top metal film and said at least one insulating film;
   etching said at least one top metal film and said at least one insulating film using the first pattern as an etch mask at the same time;
   stripping the first pattern;
   conducting a heat treatment and a cooling split,
   forming a metal pattern over said at least partially etched top metal film and insulating film in order to partially etch said at least one bottom metal film;
   etching said at least one bottom metal film, using the metal pattern as an etch mask; and
   stripping the metal pattern.

2. The method of claim 1, wherein said conducting a heat treatment and said cooling split substantially prevents metal line bridges from being formed during said etching said at least one bottom metal film.

3. The method of claim 1, wherein said conducting a heat treatment and said cooling split substantially prevents metal line bridges from being formed during said etching said at least one bottom metal film due to delays in said stripping the first pattern.

4. The method of claim 1, wherein said conducting a heat treatment and said cooling split substantially prevents metal line bridges from being formed.

5. The method of claim 4, wherein said conducting a heat treatment and said cooling split substantially prevents metal line bridges from being formed due to delays in a stripping chamber.

6. The method of claim 1, wherein the method is comprised in a method of manufacturing a metal-insulator-metal (MIM) capacitor.

7. The method of claim 1, comprising rinsing the wafer after said stripping the first pattern.

8. The method of claim 1, wherein the heat treatment and the cooling split are performed for approximately 200 seconds.

9. The method of claim 1, wherein the heat treatment and the cooling split are conducted comprise heating the wafer to at least a predetermined temperature and then quenching the wafer.

10. The method of claim 9, wherein the predetermined temperature is equal to or higher than a melting temperature of an alloy comprised in said at least one top metal film.

11. The method of claim 9, wherein the predetermined temperature is equal to or higher than a melting temperature of an alloy comprised in said at least one bottom metal film.

12. The method of claim 9, wherein the predetermined temperature is selected in accordance with a delay time a chamber where said etching said at least one top metal film and said stripping the first pattern are performed.

13. The method of claim 1, wherein a bottom electrode comprises said at least one bottom metal film.

14. The method claim 1, wherein said at least one bottom metal film comprises Al.

15. The method of claim 1, wherein said at least one bottom metal film comprises AlCu.

16. The method of claim 1, wherein a top electrode comprises said at least one top metal film.

17. The method of claim 1, wherein said at least one top metal electrode comprises Ti.

18. The method of claim 1, wherein said at least one top metal electrode comprises TiN.

19. The method of claim 1, wherein said at least one insulating film comprises SiN.

* * * * *